US012690206B2

(12) United States Patent
Derrickson et al.

(10) Patent No.: US 12,690,206 B2
(45) Date of Patent: Jul. 21, 2026

(54) HETEROJUNCTION BIPOLAR TRANSISTORS INCLUDING AN INTRINSIC BASE WITH AN ASYMMETRICAL DOPANT DEPTH PROFILE

(71) Applicant: GlobalFoundries U.S. Inc., Malta, NY (US)

(72) Inventors: Alexander Derrickson, Saratoga Springs, NY (US); Halid Mulaosmanovic, Dresden (DE); Peter Baars, Dresden (DE); Judson R. Holt, Ballston Lake, NY (US); Zhixing Zhao, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 372 days.

(21) Appl. No.: 18/408,706

(22) Filed: Jan. 10, 2024

(65) Prior Publication Data

US 2025/0227943 A1 Jul. 10, 2025

(51) Int. Cl.
*H01L 29/66* (2006.01)
*H10D 10/01* (2025.01)
*H10D 10/80* (2025.01)

(52) U.S. Cl.
CPC ......... *H10D 10/021* (2025.01); *H10D 10/821* (2025.01)

(58) Field of Classification Search
CPC .... H10D 10/021; H10D 10/821; H10D 10/80; H10D 62/184; H10D 62/60
See application file for complete search history.

(56) References Cited

U.S. PATENT DOCUMENTS 9,997,619 B1 6/2018 Balakrishnan et al.
11,652,142 B2 5/2023 Yang et al.
(Continued)

FOREIGN PATENT DOCUMENTS

EP 4235795 A1 8/2023

OTHER PUBLICATIONS

S. R. Panda et al., "A TCAD-Based Analysis of Substrate Bias Effect on Asymmetric Lateral SiGe HBT for THz Applications," in IEEE Transactions on Electron Devices, vol. 70, No. 5, pp. 2192-2198, May 2023, doi: 10.1109/TED.2023.3251281.
(Continued)

*Primary Examiner* — Mohammed R Alam
(74) *Attorney, Agent, or Firm* — Thompson Hine LLP; Francois Pagette

(57) ABSTRACT

Structures for a heterojunction bipolar transistor and methods of forming a structure for a heterojunction bipolar transistor. The structure comprises a first semiconductor layer including a first portion, a second portion, and a third portion between the first portion and the second portion, a first terminal including a first semiconductor region on the first portion of the first semiconductor layer, a second terminal including a second semiconductor region on the second portion of the first semiconductor layer, an intrinsic base laterally disposed between the first terminal and the second terminal, and an extrinsic base on the intrinsic base. The intrinsic base includes a doped region in the third portion of the first semiconductor layer, and the doped region has a dopant depth profile with a dopant concentration that is asymmetrical relative to the first terminal and the second terminal.

20 Claims, 4 Drawing Sheets

(56)        References Cited

U.S. PATENT DOCUMENTS

| | | | |
|---|---|---|---|
| 2016/0300934 A1* | 10/2016 | Cai ........................ | H10D 10/80 |
| 2020/0066876 A1 | 2/2020 | Hashemi et al. | |
| 2021/0226044 A1 | 7/2021 | Derrickson et al. | |
| 2023/0032080 A1 | 2/2023 | Derrickson et al. | |
| 2023/0092435 A1* | 3/2023 | Yang .................... | H10D 62/134 |
| | | | 257/565 |

OTHER PUBLICATIONS

A. Derrickson et al., "Assessment of THz Performance for a Lateral SiGe HBT on SOI With a Laterally Graded Base," in IEEE Transactions on Electron Devices, vol. 65, No. 11, pp. 4747-4754, Nov. 2018, doi: 10.1109/TED.2018.2869551.
European Patent Office, Extended European Search Report issued in European Patent Application No. 24187619.2 on Dec. 16, 2024; 11 pages.

* cited by examiner

HETEROJUNCTION BIPOLAR TRANSISTORS INCLUDING AN INTRINSIC BASE WITH AN ASYMMETRICAL DOPANT DEPTH PROFILE

STATEMENT REGARDING FEDERALLY SPONSORED RESEARCH OR DEVELOPMENT

This invention was made with government support under HR0011-20-3-0002 awarded by the Defense Advanced Research Projects Agency. The government has certain rights in the invention.

BACKGROUND

The disclosure relates generally to semiconductor devices and integrated circuit fabrication and, in particular, to structures for a heterojunction bipolar transistor and methods of forming a structure for a heterojunction bipolar transistor.

A bipolar junction transistor is a three-terminal electronic device that includes an emitter, a collector, and an intrinsic base that defines a p-n junction with the emitter and a p-n junction with the collector. In a PNP bipolar junction transistor, the emitter and collector are comprised of p-type semiconductor material, and the intrinsic base is comprised of n-type semiconductor material. In an NPN bipolar junction transistor, the emitter and collector are comprised of n-type semiconductor material, and the intrinsic base is comprised of p-type semiconductor material. In operation, the base-emitter junction is forward biased, the base-collector junction is reverse biased, and the collector-emitter current may be controlled with a base-emitter voltage.

A heterojunction bipolar transistor is a variant of a bipolar junction transistor in which the semiconductor materials have different energy bandgaps, which creates heterojunctions between the dissimilar semiconductor materials. For example, the collector and emitter of a heterojunction bipolar transistor may be constituted by silicon, and the intrinsic base of a heterojunction bipolar transistor may be constituted by silicon-germanium, which is characterized by a narrower band gap than silicon. Heterojunction bipolar transistors may exhibit improvements in high frequency performance because of the existence of the heterojunctions.

Improved structures for a heterojunction bipolar transistor and methods of forming a structure for a heterojunction bipolar transistor are needed.

SUMMARY

In an embodiment of the invention, a structure for a heterojunction bipolar junction transistor is provided. The structure comprises a first semiconductor layer including a first portion, a second portion, and a third portion between the first portion and the second portion, a first terminal including a first semiconductor region on the first portion of the first semiconductor layer, a second terminal including a second semiconductor region on the second portion of the first semiconductor layer, an intrinsic base laterally disposed between the first terminal and the second terminal, and an extrinsic base on the intrinsic base. The intrinsic base includes a doped region in the third portion of the first semiconductor layer, and the doped region has a dopant depth profile with a dopant concentration that is asymmetrical relative to the first terminal and the second terminal.

In an embodiment of the invention, a method of forming a structure for a heterojunction bipolar transistor is provided. The method comprises forming a first terminal including a first semiconductor region on a first portion of a semiconductor layer, and forming a second terminal including a second semiconductor region on a second portion of the semiconductor layer. The semiconductor layer includes a third portion disposed between the first portion of the semiconductor layer and the second portion of the semiconductor layer. The method further comprises forming an intrinsic base laterally disposed between the first terminal and the second terminal, and forming an extrinsic base on the intrinsic base. The intrinsic base includes a doped region in the third portion of the first semiconductor layer, and the doped region has a dopant depth profile with a dopant concentration that is asymmetrical relative to the first terminal and the second terminal.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figures 1, 2:
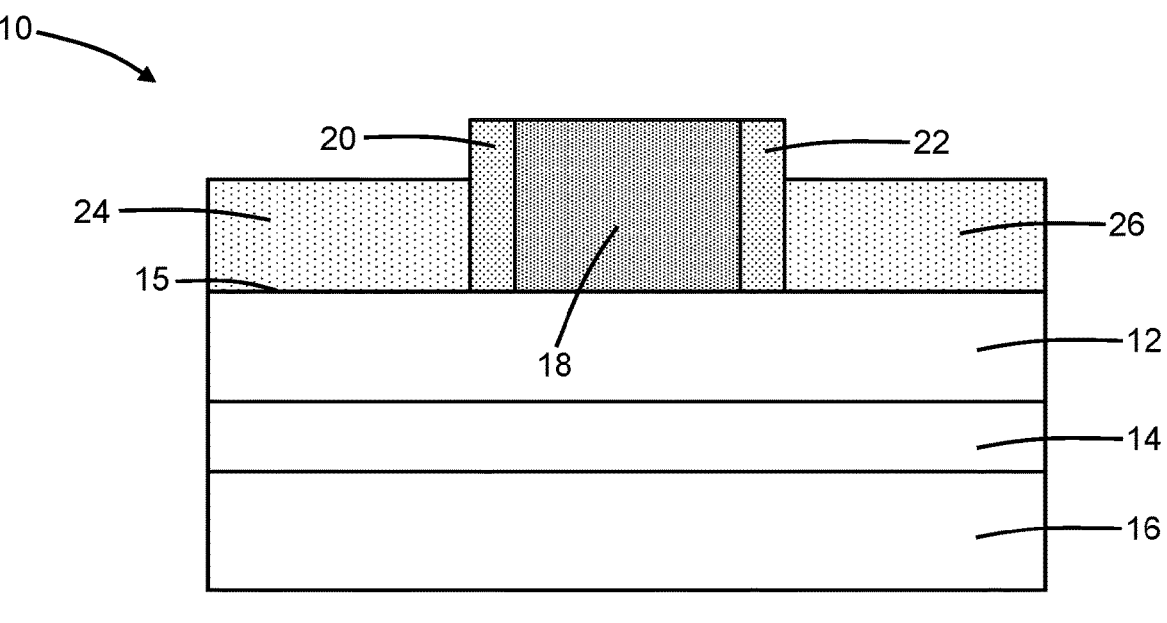
FIGS. 1-6 are cross-sectional views of a structure at successive fabrication stages of a processing method in accordance with embodiments of the invention.

With reference to FIG. 1 and in accordance with embodiments of the invention, a structure 10 for a heterojunction bipolar transistor may be formed using a semiconductor-on-insulator (SOI) substrate that includes a semiconductor layer 12, a buried insulator layer 14, and a semiconductor substrate 16. In an embodiment, the semiconductor layer 12 may be comprised of a semiconductor material, such as single-crystal silicon, and may be lightly doped to have n-type conductivity. In an alternative embodiment, the semiconductor substrate 16 may be comprised of a semiconductor material, such as single-crystal silicon, and may be lightly doped to have, for example, p-type conductivity. The buried insulator layer 14 may be comprised of a dielectric material, such as silicon dioxide, that is an electrical insulator. The semiconductor substrate 16 may be comprised of a semiconductor material, such as single-crystal silicon, and may be lightly doped to have p-type conductivity.

The buried insulator layer 14 is disposed between the semiconductor layer 12 and the semiconductor substrate 16. Specifically, the buried insulator layer 14 has a lower interface with the semiconductor substrate 16 and an upper interface with the semiconductor layer 12. In an embodiment, the semiconductor layer 12 may be significantly thinner than the semiconductor substrate 16. In an embodiment, the semiconductor layer 12 may have a thickness between the upper and lower interfaces in a range of about 20 nanometers to about 200 nanometers such that the semiconductor layer 12 is configured to fabricate partially-depleted silicon-on-insulator (PDSOI) device structures.

A gate structure 18 may be formed on a top surface 15 of the semiconductor layer 12. In an embodiment, the gate structure 18 may be comprised of a semiconductor material, such as polysilicon. Dielectric spacers 20, 22 may be formed by conformally depositing a dielectric material, such as silicon nitride, and anisotropically etching the deposited dielectric material. The dielectric spacer 20 is disposed adjacent to one side of the gate structure 18 and the dielectric spacer 22 is disposed adjacent to an opposite side of the gate structure 18.

Semiconductor regions 24, 26 may be formed on the top surface 15 of the semiconductor layer 12 after forming the gate structure 18 and the dielectric spacers 20, 21. The semiconductor region 24 is disposed adjacent to the dielectric spacer 20, and the semiconductor region 26 is disposed adjacent to the dielectric spacer 22. The semiconductor regions 24, 26 may be formed as raised epitaxial layers using an epitaxial growth process, and the semiconductor regions 24, 26 may contain single-crystal semiconductor material, such as single-crystal silicon. In an embodiment, the semiconductor regions 24, 26 may be doped with a concentration of a dopant, such as an n-type dopant (e.g., arsenic or phosphorus), to provide n-type conductivity. The crystal structure of the single-crystal semiconductor material of the semiconductor layer 12 may serve as a crystalline template for the crystal structure of the single-crystal semiconductor material of the semiconductor regions 24, 26 during epi- taxial growth.

The semiconductor regions 24, 26 may constitute portions of respective terminals (i.e., an emitter and a collector) of a heterojunction bipolar transistor. In an embodiment, the semiconductor region 24 may provide a portion of an emitter, and the semiconductor region 26 may provide a portion of collector. In an alternative embodiment, the semiconductor region 24 may provide a portion of a collec- tor, and the semiconductor region 26 may provide a portion of an emitter.

With reference to FIG. 2 in which like reference numerals refer to like features in FIG. 1 and at a subsequent fabrica- tion stage, a dielectric layer 28 may be formed with a section that covers the semiconductor region 24 and a section that covers the semiconductor region 26. In an embodiment, the dielectric layer 28 may be comprised of a dielectric material, such as silicon dioxide, that is deposited and planarized. After the dielectric layer 28 is formed, the gate structure 18 may be removed from its position between the dielectric spacer 20 and the dielectric spacer 22 by an etching process. The overlying sections of the dielectric layer 28 protect the semiconductor regions 24, 26 against etching during the removal of the gate structure 18. A cavity 30 is defined by the removal of the gate structure 18. The cavity 30 is disposed laterally between the semiconductor region 24 and the semiconductor region 26. The cavity 30 may extend from an open end to the top surface 15 of the semiconductor layer 12.

Figure 3:
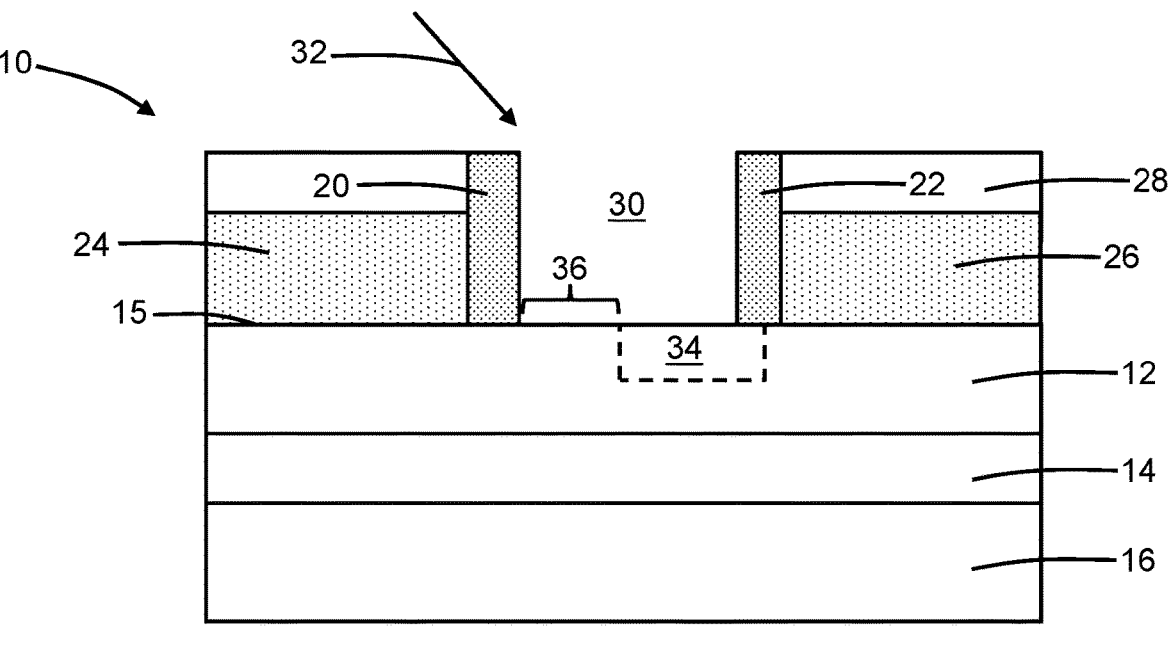

With reference to FIG. 3 in which like reference numerals refer to like features in FIG. 2 and at a subsequent fabrica- tion stage, a section 34 of the semiconductor layer 12 at the bottom of the cavity 30 is implanted with an atomic species by performing a tilted ion implantation that directs ions, as diagrammatically shown by a single-headed arrow 32. The dielectric spacer 20 may block the implantation of the ions 32 into another section 36 of the semiconductor layer 12 adjacent to the dielectric spacer 20 because of shadowing of the surface area at the top surface 15 caused by the off- normal incidence of the ions 32 during the tilted ion implan- tation. The tilt angle relative to the surface normal is chosen to define the extent of the shadowing by the dielectric spacer 20 and the surface area receiving ions 32 to form the section 34. In an embodiment, the tilted ion implantation may be performed with the SOI substrate tilted and static in rota- tional orientation. In an alternative embodiment, the tilted ion implantation may be performed with the SOI substrate inclined at a tilt angle that is rocked or varied either continuously or in discrete steps. As a result, the implanted section 34 may contain a dose of implanted ions 32 that varies with position relative to the dielectric spacer 22.

The unimplanted section 36 of the semiconductor layer 12 at the bottom of the cavity 30 is disposed laterally between the implanted section 34 and the dielectric spacer 20. In an embodiment, the implanted section 34 may extend from the top surface 15 of the semiconductor layer 12 partially through the semiconductor layer 12. In an alternative embodiment, the implanted section 34 may extend from the top surface 15 of the semiconductor layer 12 fully through the semiconductor layer 12. In an embodiment, the surface area associated with the implanted section 34 may be larger than the surface area associated with the unimplanted sec- tion 36. In an embodiment, the surface area of the semicon- ductor layer 12 associated with the implanted section 34 may be smaller than the surface area associated with the unimplanted section 36. In an embodiment, the surface area of the semiconductor layer 12 associated with the implanted section 34 may be equal to the surface area of the semicon- ductor layer 12 associated with the unimplanted section 36 of the semiconductor layer 12.

The properties of the implanted section 34 of the semi- conductor layer 12 are altered at and/or near the top surface 15 of the implanted section 34 of the semiconductor layer 12 such that, during a subsequent selective deposition process, the portion of the top surface 15 over the implanted section 34 exhibits a significantly lower epitaxial growth rate than the portion of the top surface 15 over the unimplanted section 36. In an embodiment, the ions 32 implanted to form the implanted section 34 may be, or include, carbon, which is a non-dopant in a Group IV semiconductor material, and the ions 32 may be implanted using a single implantation, or multiple implantations, at a dose and an energy effective to provide the reduced growth rate.

Figure 4:
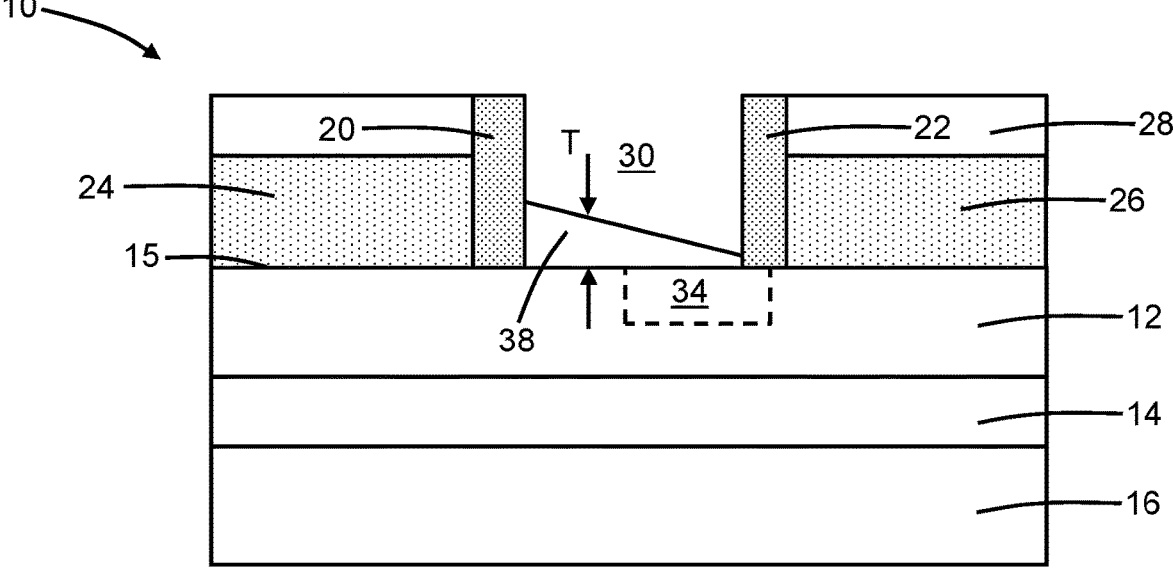

With reference to FIG. 4 in which like reference numerals refer to like features in FIG. 3 and at a subsequent fabrica- tion stage, a semiconductor layer 38 may be formed inside the cavity 30 on the top surface 15 of the semiconductor layer 12 on, and over, the implanted section 34 and the unimplanted section 36 (FIG. 4). The semiconductor layer 38, which provides a contribution to the intrinsic base of the heterojunction bipolar transistor, may directly contact the top surface 15 of the semiconductor layer 12 over the implanted section 34 and the unimplanted section 36. The semiconductor layer 38 may be comprised of a single-crystal semiconductor material that is epitaxially grown from the portion of the top surface 15 of the semiconductor layer 12 exposed at the bottom of the cavity 30 and planarized following growth.

In an embodiment, the semiconductor layer 38 may be comprised of silicon-germanium including silicon and ger- manium with the silicon content ranging from 95 atomic percent to 50 atomic percent and the germanium content ranging from 5 atomic percent to 50 atomic percent. In an embodiment, the germanium content of the semiconductor layer 38 may be non-graded over its entire volume. In an embodiment, the germanium content of the semiconductor layer 38 may be non-graded and uniform over its entire volume. In an embodiment, the germanium content of the semiconductor layer 38 may be non-graded and substantially uniform over its entire volume.

The semiconductor layer 38 may be in situ doped during epitaxial growth with a concentration of a dopant, such as a p-type dopant (e.g., boron) that provides p-type conductiv- ity. In an embodiment, the semiconductor layer 38 may be uniformly doped during epitaxial growth.

The implanted section 34 and unimplanted section 36 of the semiconductor layer 12 cause the semiconductor layer 38 to be formed with a non-uniform thickness T because of the differences in the epitaxial growth rate during formation. The semiconductor layer 38 has a thickness that varies as a function of position between the terminal including the semiconductor region 24 and the terminal including the semiconductor region 26, as well as a function of position between the dielectric spacer 20 and the dielectric spacer 22. In an embodiment, the maximum thickness of the semiconductor layer 38 may located adjacent to the dielectric spacer 20 and the semiconductor region 24, and the minimum thickness of the semiconductor layer 38 may located adjacent to the dielectric spacer 22 and the semiconductor region 26. In an embodiment, the thickness T of the semiconductor layer 38 may decrease according to a linear function between the terminal including the semiconductor region 24 and the terminal including the semiconductor region 26, as well as between the dielectric spacer 20 and the dielectric spacer 22. In an embodiment, the thickness T of the semiconductor layer 38 may decrease according to a non-linear function, according to a step function, according to a quadratic function, etc.

Figures 5, 6:
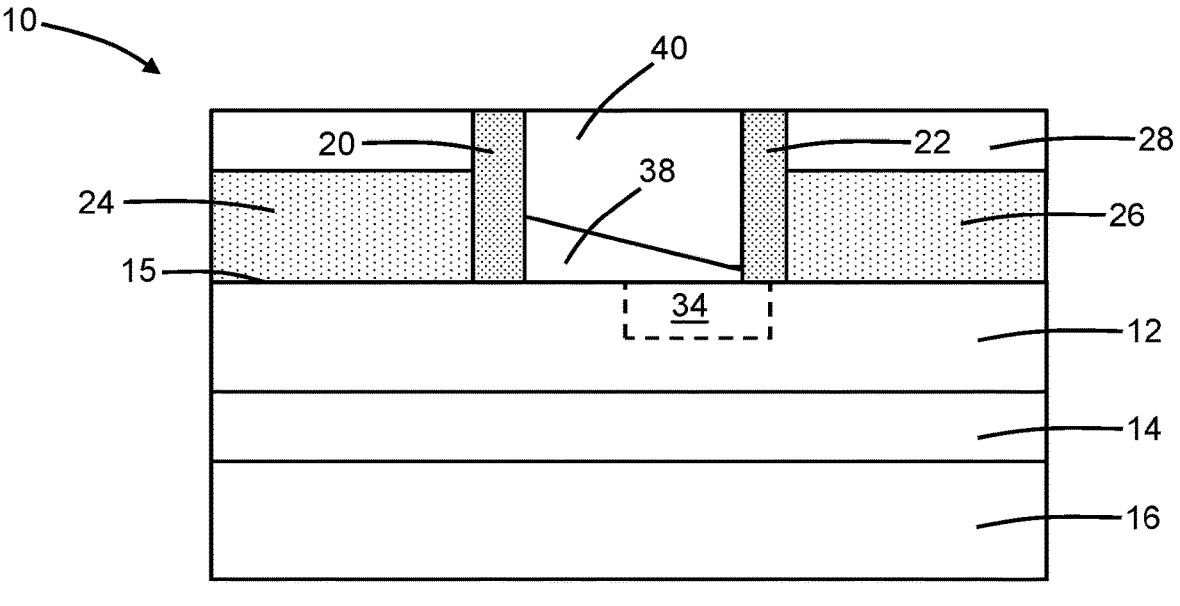

With reference to FIG. 5 in which like reference numerals refer to like features in FIG. 4 and at a subsequent fabrication stage, a semiconductor layer 40 may be formed over the semiconductor layer 38. In an embodiment, the semiconductor layer 38 may be disposed in a vertical direction between the semiconductor layer 40 and the semiconductor layer 12. The semiconductor layer 40 is comprised of a semiconductor material that is doped to have the same conductivity type as the semiconductor layer 38. In an embodiment, the semiconductor layer 40 may be comprised of a heavily-doped semiconductor material, such as polysilicon that is heavily doped with a concentration of a p-type dopant (e.g., boron) to provide p-type conductivity. The semiconductor layer 40 may provide an extrinsic base of the heterojunction bipolar transistor.

With reference to FIG. 6 in which like reference numerals refer to like features in FIG. 5 and at a subsequent fabrication stage, a thermal process, such as a rapid thermal anneal, is used to cause dopant atoms to diffuse from the semiconductor layer 40 through the semiconductor layer 38 and into a portion of the semiconductor layer 12 to define a doped region 42 in a portion of the semiconductor layer 12 beneath the semiconductor layer 38. A region 44 of the semiconductor layer 12 beneath the semiconductor layer 38 does not receive the diffused dopant atoms from the semiconductor layer 40 and retains its original dopant concentration and conductivity type. The thermal process may be controlled such that dopant atoms do not diffuse into the region 44 of the semiconductor layer 12. In an embodiment, the thermal process may be controlled such that dopant atoms do not diffuse across the entire thickness of the semiconductor layer 12, which places the doped region 42 above the interface between the semiconductor layer 12 and the buried insulator layer 14.

The dopant atoms diffused into the doped region 42 of the semiconductor layer 12 are characterized by a dopant depth profile. The dopant depth profile of the dopant concentration of the doped region 42 in the host portion of the semiconductor layer 12 has a depth D that is asymmetrical relative to the semiconductor regions 24, 26 because of an asymmetry in the concentration of the diffused dopant atoms in the doped region 42. The asymmetry in the depth D of the dopant depth profile of the doped region 42 arises because of the effect of the variation in thickness of the semiconductor layer 38 on atomic diffusion of dopant from the semiconductor layer 40 into the portion of the semiconductor layer 12 in which the doped region 42 is disposed. In an embodiment, the concentration of dopant atoms in the doped region 42 of the semiconductor layer 12 may be graded in a lateral direction and/or a vertical direction. In an embodiment, the dopant depth profile of the doped region 42 has a minimum depth D in the host portion of the semiconductor layer 12 beneath the maximum-thickness portion of the semiconductor layer 38 adjacent to the semiconductor region 24, and the dopant depth profile of the doped region 42 has a maximum depth D in the host portion of the semiconductor layer 12 beneath the minimum-thickness portion of the semiconductor layer 38 adjacent to the semiconductor region 26. In an embodiment, the lateral variation in the depth D of the dopant depth profile of the doped region 42 within the host portion of the semiconductor layer 12 may be inversely proportional to the thickness of the semiconductor layer 38. The depth D of the dopant depth profile of the doped region 42 may be measured relative to the top surface 15 of the semiconductor layer 12.

The doped region 42 of the semiconductor layer 12 that includes diffused dopant atoms and the region 44 of the semiconductor layer 12 that lacks diffused dopant atoms adjoin along an interface 46. Although the interface 46 is diagrammatically shown as inclined in FIG. 6, the interface 46 may have a different shape, such as a shape with a degree of curvature or an irregular shape. In an embodiment, the region 44 of the semiconductor layer 12 may contain an n-type dopant, and the doped region 42 of the semiconductor layer 12 may contain a p-type dopant. In an embodiment, the region 44 of the semiconductor layer 12 may contain a p-type dopant, and the doped region 42 of the semiconductor layer 12 may contain a p-type dopant at a higher dopant concentration than the region 44.

The thermal process may cause dopant atoms to diffuse from the semiconductor region 24 into an underlying portion 54 of the semiconductor layer 12 and dopant atoms to diffuse from the semiconductor region 26 into an underlying portion 56 of the semiconductor layer 12. The portions 54, 56 of the semiconductor layer 12 may extend in depth over the entirety, or a portion, of the thickness of the semiconductor layer 12. The semiconductor region 24 and the underlying portion 54 of the semiconductor layer 12 may collectively constitute a terminal of a heterojunction bipolar transistor. The semiconductor region 26 and the underlying portion 56 of the semiconductor layer 12 may collectively constitute another terminal of a heterojunction bipolar transistor. In an embodiment, the semiconductor region 24 and the underlying portion 54 of the semiconductor layer 12 may collectively constitute a collector of a heterojunction bipolar transistor, and the semiconductor region 26 and the underlying portion 56 of the semiconductor layer 12 may collectively constitute an emitter of the heterojunction bipolar transistor.

The doped region 42 and the region 44 of the semiconductor layer 12 are disposed laterally between the portion 54 of the semiconductor layer 12 and the portion 56 of the semiconductor layer 12. In an embodiment, the doped region 42 of the semiconductor layer 12 may extend laterally from the portion 54 of the semiconductor layer 12 to the portion 56 of the semiconductor layer 12. The depth D of the dopant depth profile of the doped region 42 varies as a function of lateral position between the semiconductor region 24 and the semiconductor region 26, and as a function of lateral position between the portion 54 of the semiconductor layer 12 beneath the semiconductor region 24 and the portion 56 of the semiconductor layer 12 beneath the semiconductor region 26. Specifically, the depth D of the dopant depth profile of the doped region 42 increases with increasing lateral distance from the terminal that includes semiconductor region 24 and the underlying portion 54 of the semiconductor layer 12. The minimum depth D of the dopant depth profile of the doped region 42 in the host portion of the semiconductor layer 12 is located adjacent to the terminal including the semiconductor region 24 and the portion 54 of the semiconductor layer 12, and the maximum depth D of the dopant depth profile of the doped region 42 the host portion of the semiconductor layer 12 is located adjacent to the terminal including the semiconductor region 26 and the portion 56 of the semiconductor layer 12.

The region 44, which is unaffected by dopant diffusion from the semiconductor layer 40, may provide a contribution to either the intrinsic base or one of the terminals of the heterojunction bipolar transistor. If the semiconductor layer 12 contains an n-type dopant prior to the performance of the thermal process, then the region 44 provides a contribution to the terminal that includes the semiconductor region 24 and the underlying portion 54 of the semiconductor layer 12. If the semiconductor layer 12 contains a p-type dopant prior to the performance of the thermal process, then the region 44 provides a contribution to the intrinsic base that includes the doped region 42 of the semiconductor layer 12 and the semiconductor layer 38 and may have a lower dopant concentration than the doped region 42.

The doped region 42 of the semiconductor layer 12, which is enabled by the asymmetrical shape of the semiconductor layer 38 and the diffusion of dopant atoms from the semiconductor layer 40 through the varying-thickness semiconductor layer 38 to the semiconductor layer 12, may enable tuning of the collector-base breakdown voltage and collector-to-base capacitance, as well as base narrowing, of the heterojunction bipolar transistor. The atomic species implanted into the section 34 of the semiconductor layer 12 may be dispersed into the semiconductor layer 12 by the thermal process causing dopant diffusion.

Figure 7:
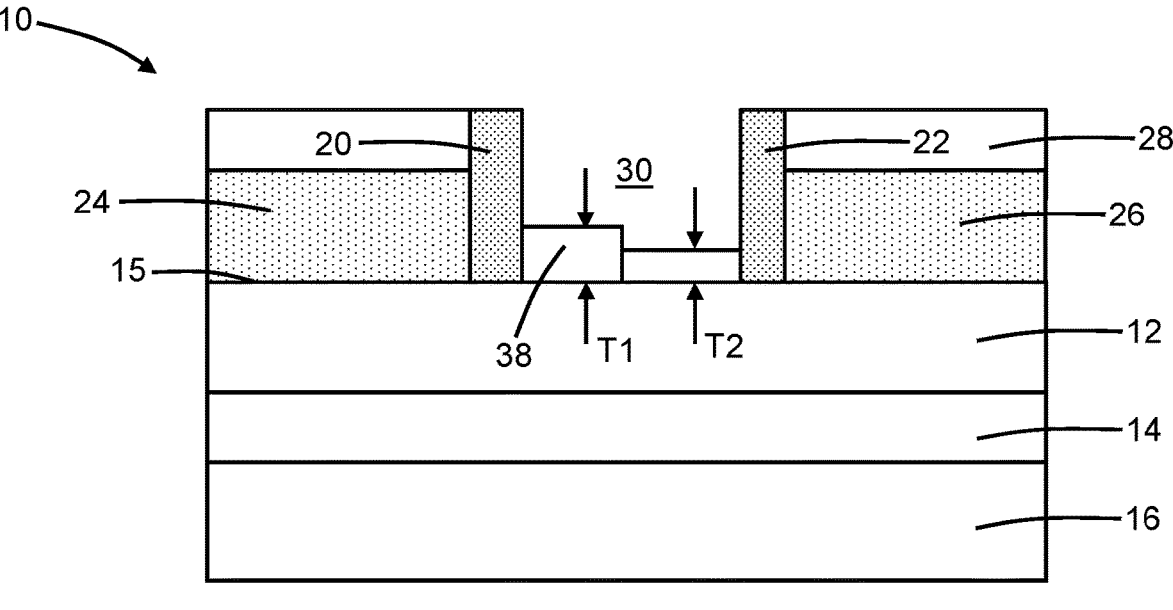
FIG. 7 is a perspective view of a structure in accordance with alternative embodiments of the invention.

With reference to FIG. 7 and in accordance with alternative embodiments, the semiconductor layer 38 may be formed with a different shape. For example, the semiconductor layer 38 may be formed with discrete portions of different thickness rather than a gradient of thicknesses and without the assistance of the implanted section 34 of the semiconductor layer 12. In an embodiment, the semiconductor layer 38 may be formed with a portion having a thickness T1 and a portion having a thickness T2 that is less than the thickness T1. The different thicknesses of the semiconductor layer 38 will contribute to the subsequent formation of the doped region 42 of the semiconductor layer 12 that has an asymmetrical dopant depth profile. The portion of the semiconductor layer 38 with the larger thickness T1 slows the diffusion of dopant from the semiconductor layer 40 forming the doped region 42, during the associated thermal process, relative to the portion of the semiconductor layer 38 with the thickness T2.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature with either direct contact or indirect contact.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a heterojunction bipolar transistor, the structure comprising:

a first semiconductor layer including a first portion, a second portion, and a third portion between the first portion and the second portion;

a first terminal including a first semiconductor region on the first portion of the first semiconductor layer;

a second terminal including a second semiconductor region on the second portion of the first semiconductor layer;

an intrinsic base laterally disposed between the first terminal and the second terminal, the intrinsic base including a second semiconductor layer and a first doped region in the third portion of the first semiconductor layer, the first doped region having a dopant depth profile with a first dopant concentration that is asymmetric between the first semiconductor region and the second semiconductor region, and; and an extrinsic base on the intrinsic base, wherein the second semiconductor layer is positioned between the extrinsic base and the third portion of the first semiconductor layer, and the second semiconductor layer has a thickness that varies as a function of position between the first semiconductor region and the second semiconductor region.

2. The structure of claim 1 wherein the second semiconductor layer comprises silicon-germanium.

3. The structure of claim 1 wherein the second semiconductor layer has a maximum thickness adjacent to the first semiconductor region and a minimum thickness adjacent to the second semiconductor region.

4. The structure of claim 3 wherein the first terminal is a collector of the heterojunction bipolar transistor, and the second terminal is an emitter of the heterojunction bipolar transistor.

5. The structure of claim 1 wherein the second semiconductor layer has a thickness that increases with increasing distance from the first semiconductor region.

6. The structure of claim 1 further comprising:

a first dielectric spacer disposed between the first semiconductor region and the second semiconductor layer; and a second dielectric spacer disposed between the second semiconductor region and the second semiconductor layer, wherein the second semiconductor layer is laterally disposed between the first dielectric spacer and the second dielectric spacer.

7. The structure of claim 6 wherein the extrinsic base is laterally disposed between the first dielectric spacer and the second dielectric spacer.

8. The structure of claim 1 wherein the first terminal includes a first doped region in the first portion of the first semiconductor layer, the second terminal includes a doped region in the second portion of the first semiconductor layer, and the first doped region of the intrinsic base is laterally disposed between the first doped region of the first terminal and the doped region of the second terminal.

9. The structure of claim 8 wherein the first terminal includes a second doped region in the third portion of the first semiconductor layer, the second doped region of the first terminal has the same conductivity type as the first doped region of the first terminal, and the second doped region of the first terminal is adjacent to the first doped region of the intrinsic base.

10. The structure of claim 8 wherein the intrinsic base includes a second doped region in the third portion of the first semiconductor layer, the second doped region of the intrinsic base is adjacent to the first doped region of the intrinsic base, the first doped region of the intrinsic base and the second doped region of the intrinsic base have the same conductivity type, and the second doped region of the intrinsic base has a lower dopant concentration than the first doped region of the intrinsic base.

11. The structure of claim 1 wherein the dopant depth profile of the first doped region of the intrinsic base has a depth in the third portion of the first semiconductor layer that increases with increasing distance from the first semiconductor region.

12. The structure of claim 1 wherein the dopant depth profile of the first doped region of the intrinsic base has a depth in the third portion of the first semiconductor layer that varies as a function of position between the first semiconductor region and the second semiconductor region.

13. The structure of claim 1 wherein the dopant depth profile of the first doped region of the intrinsic base has a minimum depth in the third portion of the first semiconductor layer adjacent to the first terminal, and the dopant depth profile of the first doped region of the intrinsic base has a maximum depth in the third portion of the first semiconductor layer adjacent to the second terminal.

14. The structure of claim 13 wherein the second semiconductor layer has a maximum thickness adjacent to the first semiconductor region, and the second semiconductor layer has a minimum thickness adjacent to the second semiconductor region.

15. The structure of claim 14 wherein the second semiconductor layer comprises silicon-germanium.

16. The structure of claim 13 wherein the first terminal is a collector of the heterojunction bipolar transistor, and the second terminal is an emitter of the heterojunction bipolar transistor.

17. The structure of claim 13 wherein the first terminal includes a doped region in the first portion of the first semiconductor layer, the second terminal includes a doped region in the second portion of the first semiconductor layer, and the first doped region of the intrinsic base is laterally disposed between the doped region of the first terminal and the doped region of the second terminal.

18. A method of forming a structure for a heterojunction bipolar transistor, the method comprising:

forming a first terminal including a first semiconductor region on a first portion of a first semiconductor layer;

forming a second terminal including a second semiconductor region on a second portion of the first semiconductor layer;

forming an intrinsic base laterally disposed between the first terminal and the second terminal; and forming an extrinsic base on the intrinsic base, wherein the first semiconductor layer includes a third portion disposed between the first portion of the first semiconductor layer and the second portion of the first semiconductor layer, the intrinsic base includes a second semiconductor layer and a doped region in the third portion of the first semiconductor layer, the doped region has a dopant depth profile with a dopant concentration that is asymmetric between the first semiconductor region and the second semiconductor region, the second semiconductor layer is positioned between the extrinsic base and the third portion of the first semiconductor layer, and the second semiconductor layer has a thickness that varies as a function of position between the first semiconductor region and the second semiconductor region.

19. The structure of claim 2 wherein the second semiconductor layer and the first doped region include a p-type dopant.

20. The structure of claim 15 wherein the second semiconductor layer and the first doped region include a p-type dopant.

* * * * *